(12) United States Patent
Seo

(10) Patent No.: US 12,477,731 B2
(45) Date of Patent: Nov. 18, 2025

(54) METHOD OF MANUFACTURING THREE-DIMENSIONAL SEMICONDUCTOR MEMORY DEVICE

(71) Applicant: SK hynix Inc., Icheon-si (KR)

(72) Inventor: Moon Sik Seo, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 651 days.

(21) Appl. No.: 17/718,767

(22) Filed: Apr. 12, 2022

(65) Prior Publication Data
US 2023/0133334 A1    May 4, 2023

(30) Foreign Application Priority Data

Nov. 3, 2021   (KR) .................. 10-2021-0149617

(51) Int. Cl.
| | | |
|---|---|---|
| *H10B 43/27* | (2023.01) | |
| *H10B 41/10* | (2023.01) | |
| *H10B 41/27* | (2023.01) | |
| *H10B 41/35* | (2023.01) | |
| *H10B 43/10* | (2023.01) | |
| *H10B 43/35* | (2023.01) | |

(52) U.S. Cl.
CPC ............. *H10B 43/27* (2023.02); *H10B 41/10* (2023.02); *H10B 41/27* (2023.02); *H10B 41/35* (2023.02); *H10B 43/10* (2023.02); *H10B 43/35* (2023.02)

(58) Field of Classification Search
CPC ........ H10B 43/27; H10B 41/10; H10B 41/27; H10B 41/35; H10B 43/10; H10B 43/35; H01L 29/40117
See application file for complete search history.

(56) References Cited

U.S. PATENT DOCUMENTS

| | | | |
|---|---|---|---|
| 2011/0001178 A1* | 1/2011 | Iwase | H10B 43/27 257/315 |
| 2020/0119042 A1* | 4/2020 | Chen | H01L 21/0206 |
| 2020/0235113 A1* | 7/2020 | Oh | H10B 43/35 |

FOREIGN PATENT DOCUMENTS

| | | |
|---|---|---|
| KR | 100714901 B1 | 5/2007 |
| KR | 101792778 B1 | 11/2017 |

* cited by examiner

*Primary Examiner* — Jessica S Manno
*Assistant Examiner* — Christopher A. Schodde
(74) *Attorney, Agent, or Firm* — WILLIAM PARK AND ASSOCIATES LTD.

(57) ABSTRACT

A method of manufacturing a three-dimensional semiconductor memory device includes forming a preliminary channel hole through a vertical stack structure including first layers and second layers that are alternately stacked, oxidizing an inner surface of the preliminary channel hole to form a sacrificial layer, removing the sacrificial layer to form a final channel hole, and forming a channel plug in the final channel hole.

10 Claims, 24 Drawing Sheets

METHOD OF MANUFACTURING THREE-DIMENSIONAL SEMICONDUCTOR MEMORY DEVICE

CROSS-REFERENCES TO RELATED APPLICATION

The present application claims priority under 35 U.S.C. § 119(a) to Korean application number 10-2021-0149617, filed on Nov. 3, 2021, in the Korean Intellectual Property Office, which is incorporated herein by reference in its entirety.

BACKGROUND

1. Technical Field

Various embodiments generally relate to a semiconductor memory device and a method of manufacturing the same, more particularly, to a three-dimensional semiconductor memory device and a method of manufacturing the three-dimensional semiconductor memory device.

2. Related Art

An integration degree of a semiconductor memory device may be determined by an occupying area of a unit memory cell. As the integration degree of the semiconductor memory device including a single memory cell on a substrate may reach to a limit, a three-dimensional semiconductor memory device including a plurality of memory cells stacked on a substrate may be proposed. Further, to improve operational reliability of the three-dimensional semiconductor memory device, various structures of fabrication methods may be proposed.

SUMMARY

In one embodiment, a method of manufacturing a three-dimensional semiconductor memory device includes forming a preliminary channel hole through a vertical stack structure including first layers and second layers that are alternately stacked, oxidizing an inner surface of the preliminary channel hole to form a sacrificial layer, removing the sacrificial layer to form a final channel hole, and forming a channel plug in the final channel hole.

BRIEF DESCRIPTION OF THE DRAWINGS

The above and another aspects, features and advantages of the subject matter of the present disclosure will be is more clearly understood from the following detailed description taken in conjunction with the accompanying drawings, in which.

DETAILED DESCRIPTION

Various embodiments of the present disclosure will be described in greater detail with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present disclosure as defined in the appended claims.

The present disclosure is described herein with reference to cross-section and/or plan illustrations of idealized embodiments of the present disclosure. However, embodiments of the present disclosure should not be construed as limiting the inventive concept, Although a few embodiments of the present disclosure will be shown and described, it will be appreciated by those of ordinary skill in the art that changes may be made in these embodiments without departing from the principles and spirit of the present disclosure.

Example embodiments may provide a three-dimensional semiconductor memory device with a high integration degree.

Example embodiments may also provide a method of to manufacturing the above-mentioned three-dimensional semiconductor memory device.

Figure 1A:
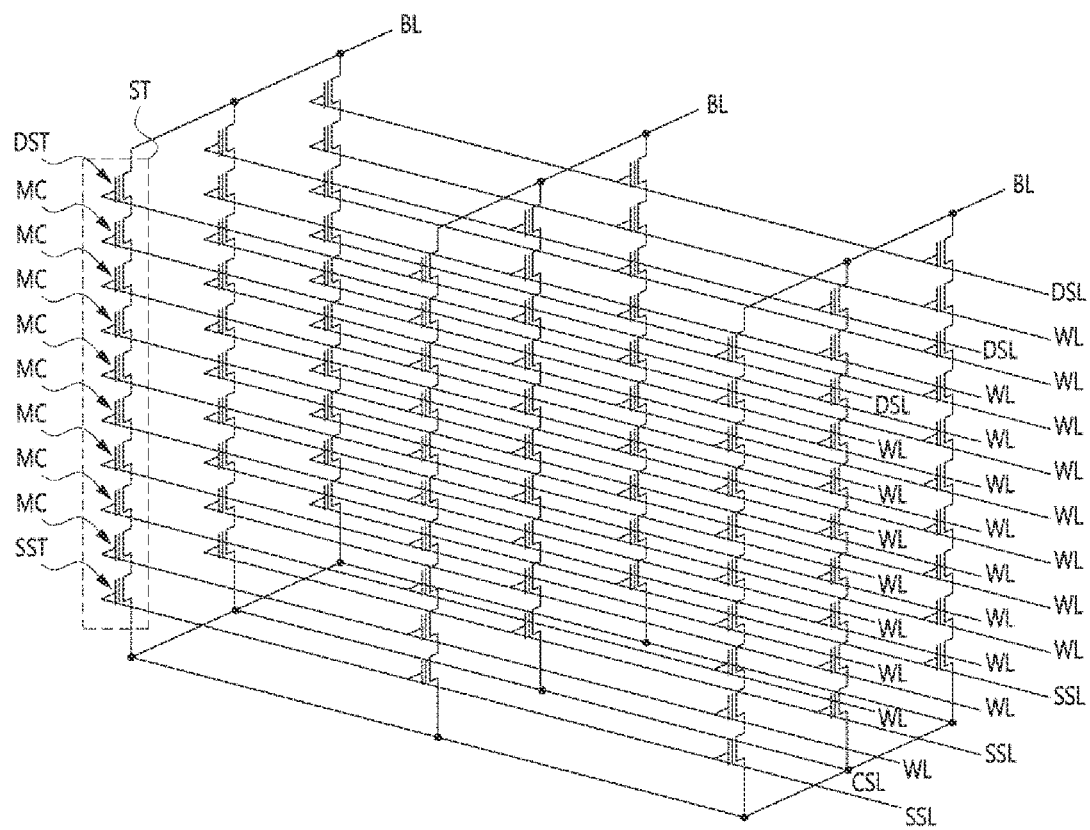
FIGS. 1A to 1C are views illustrating a three-dimensional semiconductor memory device in accordance with example embodiments.
Figure 1B:
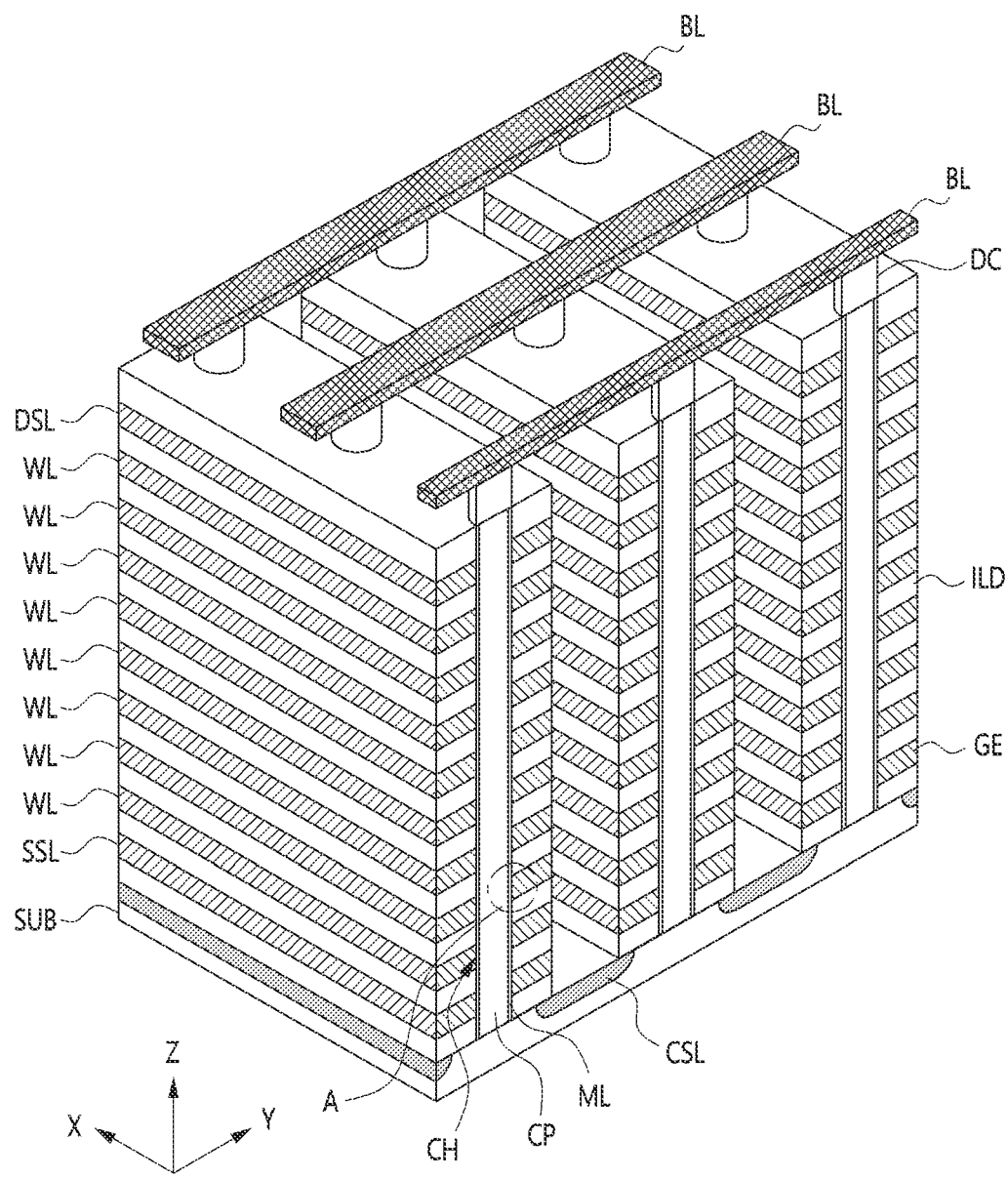
Figure 1C:
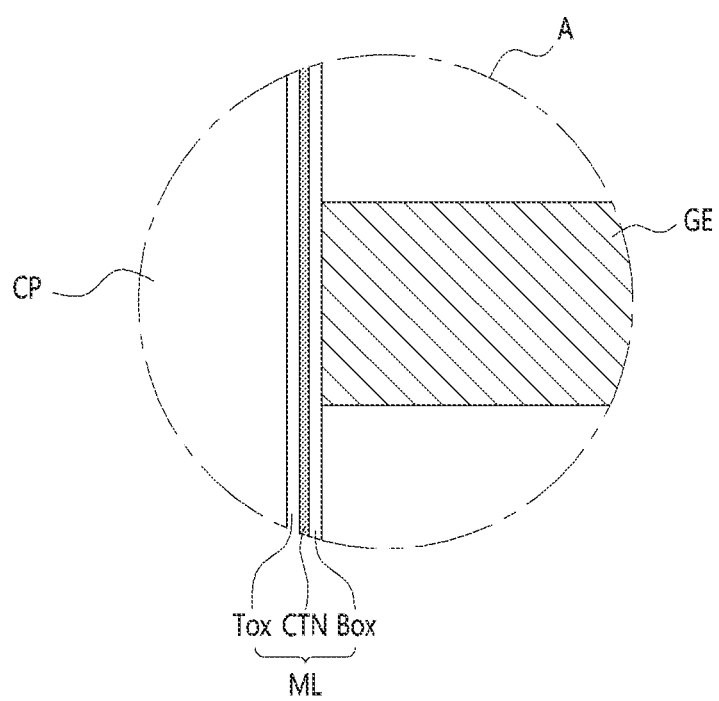

FIGS. 1A to 1C are views illustrating a three-dimensional semiconductor memory device in accordance with example embodiments. FIG. 1A is a circuit diagram illustrating the three-dimensional semiconductor memory device. FIG. 1B is a perspective view illustrating the three-dimensional semiconductor memory device in FIG. 1A. FIG. 1C is an enlarged view illustrating a portion of "A" in FIG. 1B.

Referring to FIG. 1A, a three-dimensional semiconductor memory device may include a plurality of strings ST, a plurality of bit lines BL, a plurality of word lines WL, a plurality of drain selection lines DSL, a plurality of source selection lines SSL, and a common selection line CSL. The number of strings ST, the bit lines BL, the word lines WL, the drain selection lines DSL and the source selection lines SSL might not be restricted to the numbers that are shown in FIG. 1A and may be variously changed in accordance with requirements.

The strings ST may be connected to the bit lines BL and the common selection line CSL. The number of strings ST that are connected to each of the bit lines BL may be changed. Each of the strings ST may include a source selection transistor SST, a plurality of memory cells MC, and a drain selection transistor DST, serially connected with each other. In example embodiments, the eight memory cells MC may be serially connected between one source selection transistor SST and one drain selection transistor DST. However, the present disclosure is not limited thereto. The memory cells MC and strings ST may correspond to NAND flash memory cells and NAND strings.

Both junctions of the source selection transistor SST may be connected to the common selection line CSL and one junction of the adjacent memory cell MC. A gate of the source selection transistor SST may be connected to the source selection line SSL. Both junctions of each of the memory cells MC may be connected to the adjacent memory cell MC, the adjacent source selection transistor SST, or one junction of the adjacent drain selection transistor DST. The gate of each of the memory cells MC may be connected to the corresponding word line WL. Both junctions of the drain selection transistor DST may be connected to the bit line BL and one junction of the adjacent memory cell MC. The gate of the drain selection transistor DST may be connected to the corresponding drain selection line DSL.

Bias that is applied to the word line WL that is connected to a selected memory cell MC, the source selection line SSL and the drain selection line DSL that are connected to the source selection transistor SST and the drain selection transistor DST of the string ST including the selected memory cell MC, and the string ST including the selected memory cell MC may be controlled to perform a write operation, a read operation, etc., with respect to the selected memory cell MC. Each of the memory cells MC may store at least one bit. For example, each of the memory cells MC may be a single level cell (SLC), a multi-level cell (MCL), a triple level cell, etc.

FIG. 1B illustrates the three-dimensional semiconductor memory device in FIG. 1A including memory cells vertically arranged and/or stacked.

Referring to FIG. 1B, a substrate SUB may include a semiconductor material, such as silicon including impurities, for example, p type impurities. Common selection lines CSL may be doped with impurities with a conductive type that is opposite to the conductive type of the substrate SUB, for example, n type impurities. The common selection lines CSL may be extended in an X-direction. The common selection lines CSL may be spaced apart from each other along a Y-direction.

A vertical stack structure may be arranged on the substrate SUB. The vertical stack structure may be positioned between the adjacent common selection lines CSL. The vertical stack structure may be extended in the X-direction. The vertical stack structure may include a plurality of gate electrodes GE and insulation patterns ILD that are alternately stacked. The vertical stack structure may be spaced apart from each other along the Y-direction. The gate electrodes GE may function as the source selection line SSL, the word line WL, or the drain selection line DSL. For example, a lowermost gate electrode GE may function as the source selection line SSL. An uppermost gate electrode GE may function as the drain selection line DSL. The remaining gate electrodes GE may function as the word line WL.

A channel plug CP may be formed through the vertical stack structure. The channel plug CP may be connected to the substrate SUB. The channel plug CP may be positioned between the adjacent common selection lines CSL. The channel plug CP may be arranged in a matrix shape along the X-direction and the Y-direction. The channel plug CP may have a post shape that is extended in a Z-direction. The channel plug CP may include a semiconductor material, such as silicon.

A memory layer ML may be formed between the channel plug CP and the vertical stack structure. Referring to FIG. 1C, the memory layer ML may have a three-layered structure. Particularly, the memory layer ML may include a tunnel insulation layer Toot, a charge storage layer CTN, and a charge blocking layer Box that are sequentially stacked from the channel plug CP. In example embodiments, the memory layer ML may have a cylindrical shape that extends in the Z-direction, configured to surround the channel plug CP. However, the present disclosure is not limited thereto. The shape of the memory layer ML may be variously changed under the condition that the memory layer ML may be positioned between the channel plug CP and the gate electrode GE as the word line WL. A gate insulation layer, different from the memory layer ML, may be formed between the channel plug CP and the gate electrode GE as the drain selection line DSL and/or between the channel plug CP and the gate electrode GE as the source selection line SSL.

One word line WL, configured to surround one channel plug CP and the memory layer ML that is between the word line WL and the channel plug CP, may form one memory cell MC. One source selection line SSL, configured to surround one channel plug CP and the memory layer ML (or the gate insulation layer) that is between the source selection line SSL and the channel plug CP, may form one source selection transistor SST. One drain selection line DSL, configured to surround one channel plug CP and the memory layer ML (or the gate insulation layer) that is between the drain selection line DSL and the channel plug CP, may form one drain selection transistor DST. Further, the source selection transistor SST, the memory cells MC, and the drain selection transistor DST that are stacked on one channel plug CP may form the string ST.

A drain contact DC may be formed on each of the upper surfaces of the channel plugs CP. The drain contact DC may include a semiconductor material that is doped with n type impurities.

The bit lines BL may be arranged on the drain contact. The bit lines BL may be extended in the Y-direction. The bit lines BL may be spaced apart from each other along the X-direction.

Therefore, the three-dimensional semiconductor memory device may be formed on the substrate SUB as shown in FIG. 1B.

Here, as the integration degree of a semiconductor memory device is increased, the number of memory cells MC that are stacked along the Z-direction may also be increased to generate a process error. For example, to form the channel plug CP, the vertical stack structure including the gate electrodes GE and the insulation patterns ILD, or sacrificial layers and the insulation patterns ILD may be etched to form a channel hole configured to expose an upper surface of the substrate SUB. An etch burden may be greatly increased due to the high height of the vertical stack structure so that it may be difficult to perform a normal etch. Particularly, because the channel hole may have an angular planar shape, not a circular shape, this may cause a problem.

When the charge blocking layer Box, the charge storage layer CTN, and the tunnel insulation layer Tox are sequentially formed on the angular channel hole to form the memory layer ML, the memory layer ML may also have a shape that is substantially equal to or similar to the shape of the channel hole. That is, angular portions may also be formed at outer and inner surfaces of the charge blocking layer Box, the charge storage layer CTN, and the tunnel insulation layer Tox. In this case, an electric field may be concentrated on the angular portion to deteriorate characteristics of the memory cells MC.

Further, each angled portion of the channel hole may be different from each other in accordance with heights of the vertical stack structures. That is, a plurality of the angular portions may be generated in the channel hole at a height. In contrast, a relatively small number of angular portions may be generated in the channel hole at a different height.

Further, the angular portion might not be to generated in the channel hole at the different height. Thus, the characteristic deteriorations of the memory cells MC may be different from each other to reduce the characteristic uniformity of the memory cells MC.

Hereinafter, a method of manufacturing a three-dimensional semiconductor memory device in accordance with example embodiments may be illustrated in detail.

FIGS. 2A to 2C, 3A to 3D, 4A and 4B, 5A and 5B, 6A and 6B, and 7A and 7B are views illustrating a method of manufacturing a three-dimensional semiconductor memory device in accordance with example embodiments. FIGS. 2A, 3A, 4A, 5A, 6A, and 7A are plan views, FIGS. 2B, 3B, 4B, 5B, 6B, and 7B are cross-sectional views, taken along a line I-I', and FIGS. 2C and 3C are enlarged views of a portion "B" in FIGS. 2B and 3B.

Figure 2A:
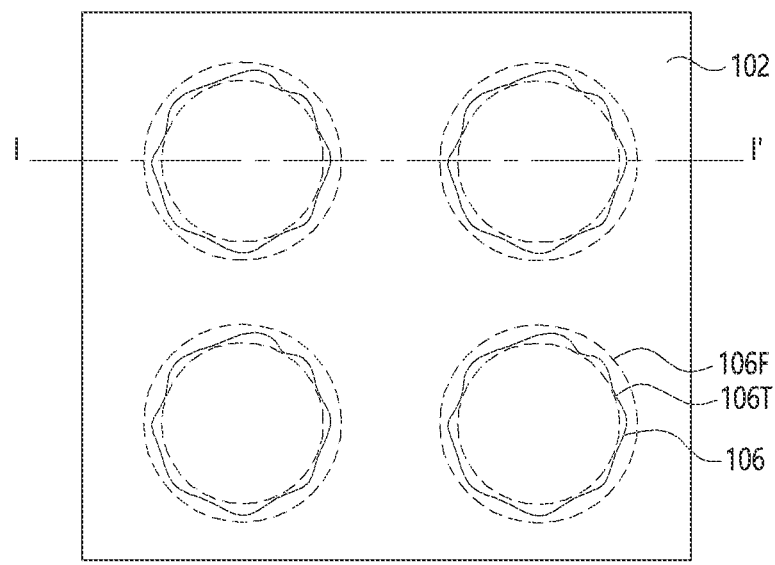
FIGS. 2A to 2C, 3A to 3D, 4A and 4B, 5A and 5B, 6A and 6B, 7A and 7B are views illustrating a method of manufacturing a three-dimensional semiconductor memory device in accordance with example embodiments.
Figure 2B:
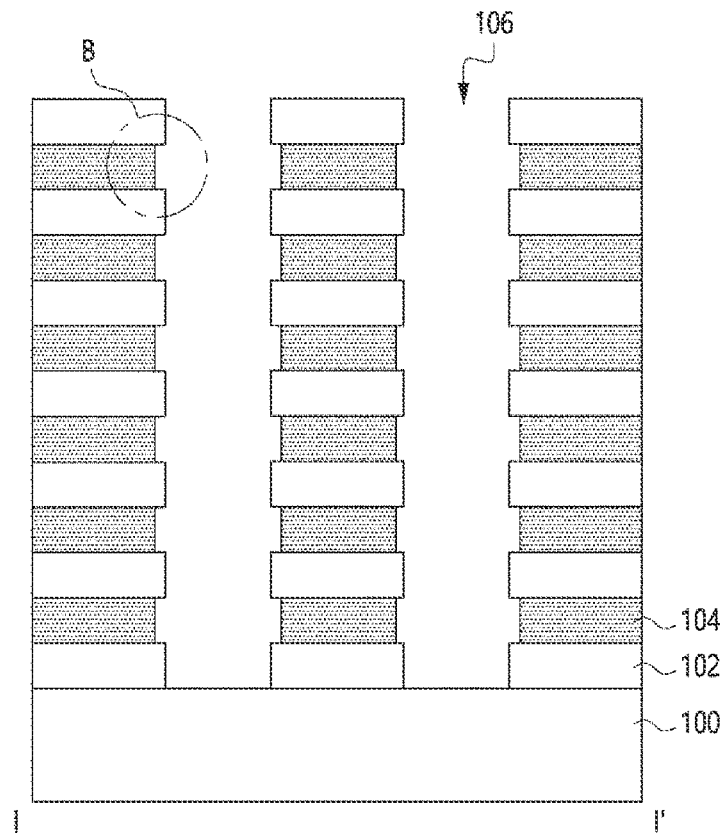
Figure 2C:
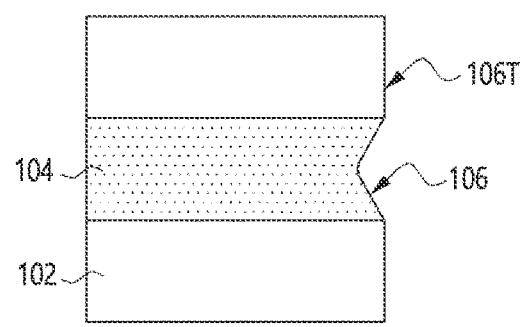

Referring to FIGS. 2A to 2C, first layers 102 and second layers 104 may be alternately formed on a substrate 100 to form a vertical stack structure. Channel holes may then be formed through the vertical stack structure.

The substrate 100 may include a semiconductor material, such as silicon. Although not depicted in drawings, a lower structure may be formed in the substrate 100. For example, the substrate 100 may include a source region. Alternatively, the substrate 100 may include a connection member configured to connect a pair of channels with each other.

The second layers 104 may be converted into gate to electrodes 122 through subsequent processes. The second layers 104 may include a material with an etching selectivity with respect to an etchant that is different from an etching selectivity of a material of the first layers 102. For example, the first layers 102 may include an insulation material, such as silicon oxide. The second layers 104 may include silicon nitride.

The channel holes may be formed through the vertical stack structure to expose upper surfaces of the substrate 100. The channel hole may provide a space in which a channel may be formed. For example, as shown in FIG. 2A, the channel hole may be arranged in the matrix shape.

In etching the vertical stack structure to form the channel hole, an ideal channel hole (hereinafter, referred to as a target channel hole 106T) may have a circular shape in a planar view. An actually etched channel hole (hereinafter, referred to as an actual channel hole 106) may have a polygonal shape.

In example embodiments, the target channel hole 106T may have a size of about 70% to about 95% of a size of a final channel hole 106F. The actual channel hole 106 may have an average diameter of about 70% to about 95% of a diameter of the final channel hole 106F. After forming the target channel hole 106T with the size smaller than the size of the final channel hole 106F, the final channel hole 106F may have a desired diameter through a subsequent etch process.

As shown in FIG. 2A, the actual channel hole 106 may to have a polygonal shape, not a circular shape, in the planar view. Particularly, the shape of the actual channel hole 106 may be determined in etching the second layers 104. As shown in FIG. 2C, each of the first layers 102 may have a vertical profile. In contrast, each of the second layers 104 may have a "C" shaped profile with a gradually concave central portion.

As mentioned above, when the channel hole has a polygonal shape, a memory layer 116 may have a shape that is determined by the shape of the channel hole so that an electric field may be concentrated on angular portions to generate the characteristic deterioration.

Figure 3A:
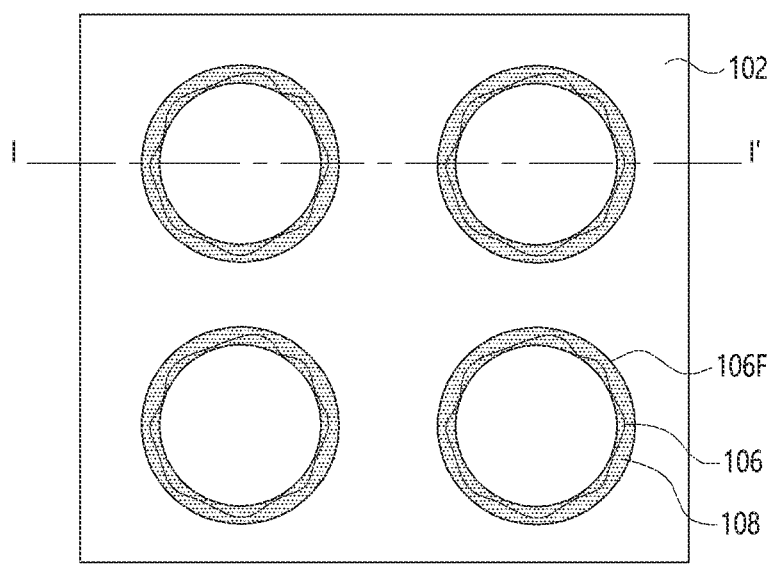
Figure 3B:
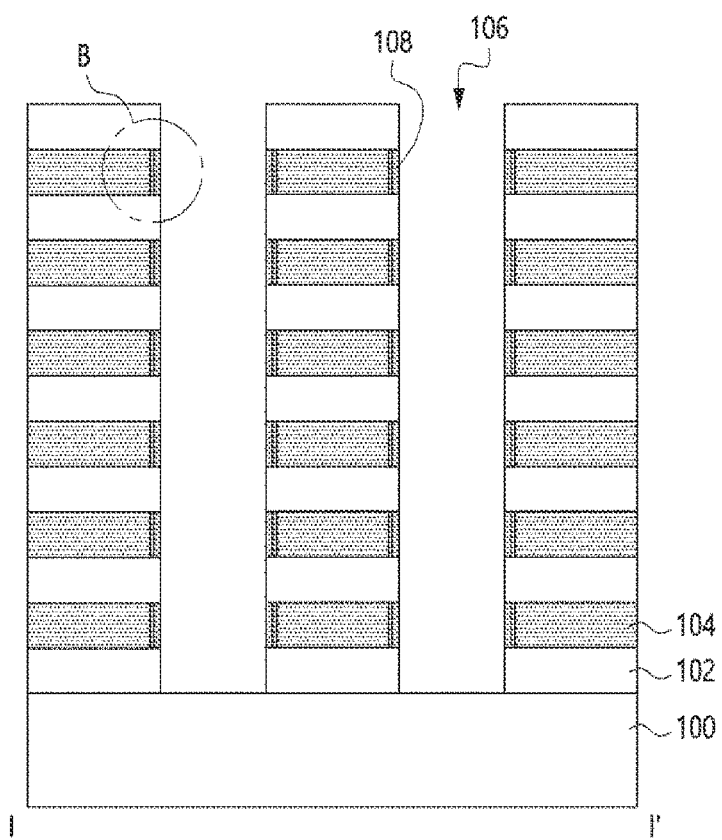
Figure 3C:
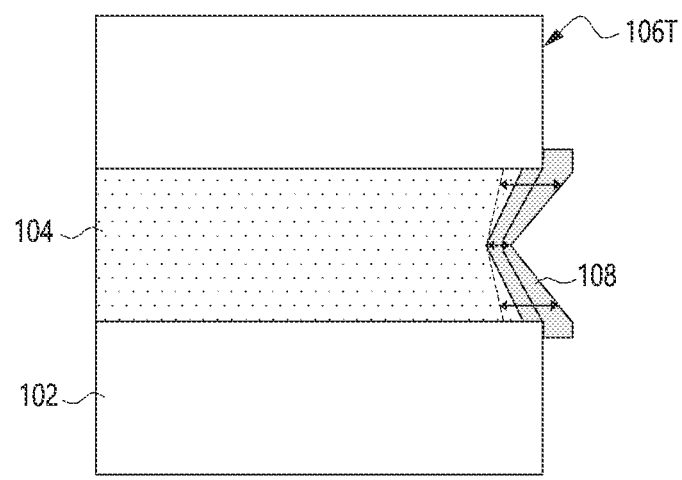

Referring to FIGS. 3A to 3C, a sacrificial layer 108 may be formed in the actual channel hole 106. The sacrificial layer 108 may be conformally formed along an inner surface of the actual channel hole 106 so that the actual channel hole 106 might not be filled with the sacrificial layer 108.

In example embodiments, the sacrificial layer 108 may be formed through an oxidation process. As shown in FIG. 3C, the infiltration depths of oxygen may be different from each other in accordance with profiles of the second layer 104 in the actual channel hole 106. Less oxygen may infiltrate into the concave portion of the second layer 104, for example, a central portion of the second layer 104 in FIG. 3C so that an oxidized layer may have a relatively thin thickness. In contrast, the oxygen may easily infiltrate into an edge portion of the second layer 104 so that an oxidized layer may have a relatively thick thickness. Thus, the edge portion of the second layer 104 may be relatively thickly oxidized and the central portion of the second layer 104 may be relatively thinly oxidized.

Figure 3D:
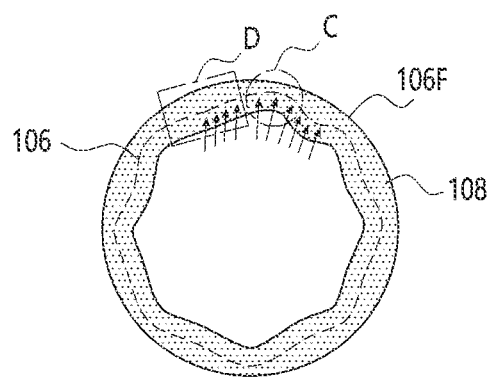

FIG. 3D show a process for forming the sacrificial layer 108. Referring to FIG. 3D, the infiltration depths of oxygen may be is different from each other in accordance with the profiles of the actual channel hole 106. The oxygen may hardly infiltrate into a concave portion C, the concave portion C with a concave shape in relation to an outer lining of a virtual circle (not shown), in the actual channel hole 106 so that an oxidized layer may have a relatively thin thickness. In contrast, the oxygen may easily infiltrate into a flat portion D in the actual channel hole 106 so that an oxidized layer may have a relatively thick thickness. Thus, the concave portion may be relatively thinly oxidized, and the flat portion may be relatively thickly oxidized.

The sacrificial layer 108 may include silicon oxide, silicon oxynitride, a combination thereof, etc. As mentioned above, when the first layers 102 includes silicon oxide and the second layers 104 may include silicon nitride, a portion in which the first layers 102 may be formed might not be thermally oxidized. In contrast, the silicon nitride in a portion in which the second layers 104 may be formed may be oxidized so that the silicon oxynitride and the silicon oxide may be mixed.

Figure 4A:
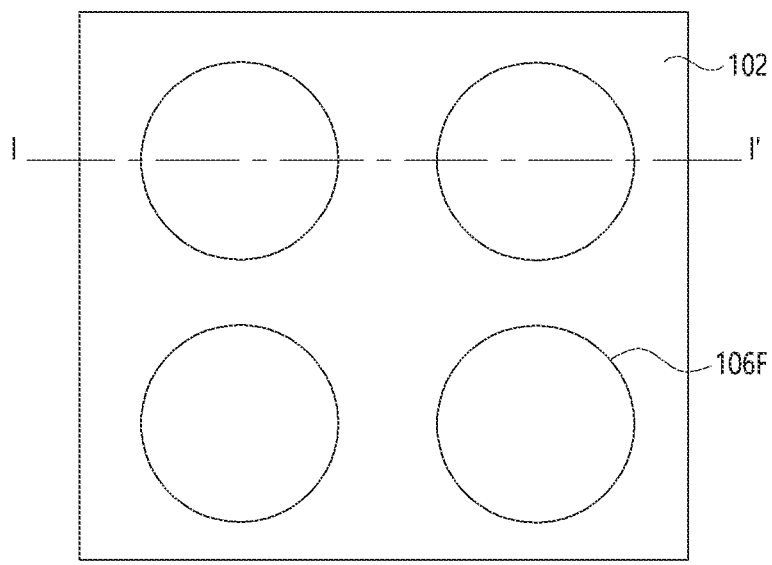
Figure 4B:
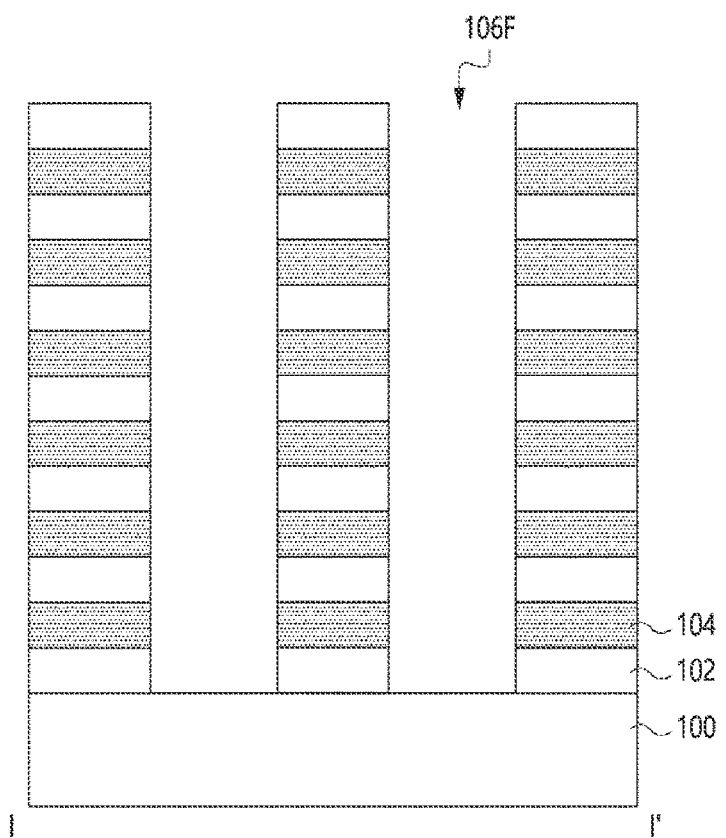

Referring to FIGS. 4A and 4B, the vertical stack structure with the sacrificial layer 108 may be etched to form the final channel hole 106F with a size larger than the size of the actual channel hole 106. In example embodiments, the size of the actual channel hole 106 may be about 70% to about 95% of the size of the final channel hole 106F. The final channel hole 106F may be formed through an etch process.

In the etch process, the first layers 102, the sacrificial layer 108 and the second layers 104 in the vertical stack structure may be partially etched to provide the final channel hole 106F with a vertical profile. Thus, the memory layer 116 in the final channel hole 106F might not have any angular portion to prevent the deterioration of the memory cell that is caused by the concentration of the electric field.

In example embodiments, the process for forming the sacrificial layer 108 in FIGS. 3A and 3B and the process illustrated with reference to FIGS. 4A and 4B may be repeated. In this case, the final channel hole 106F may have the right vertical profile.

Figure 5A:
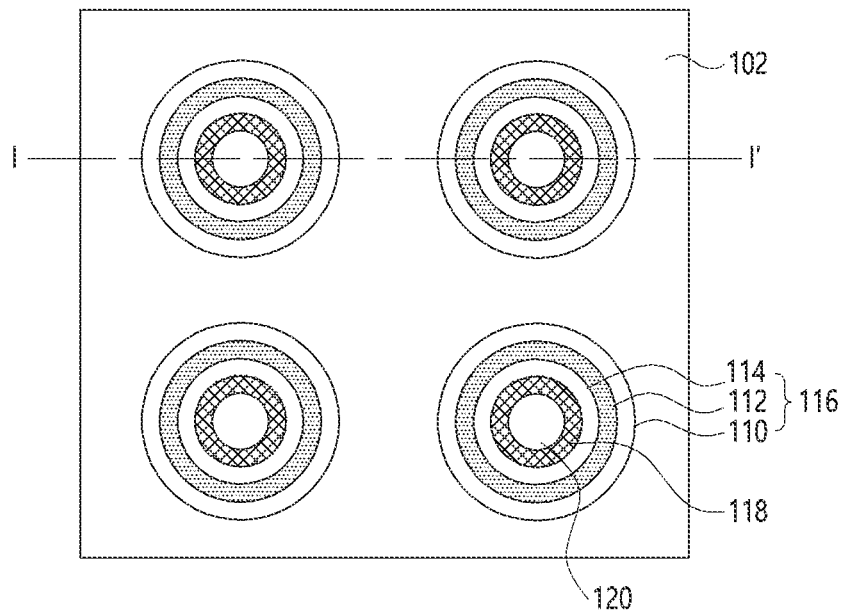
Figure 5B:
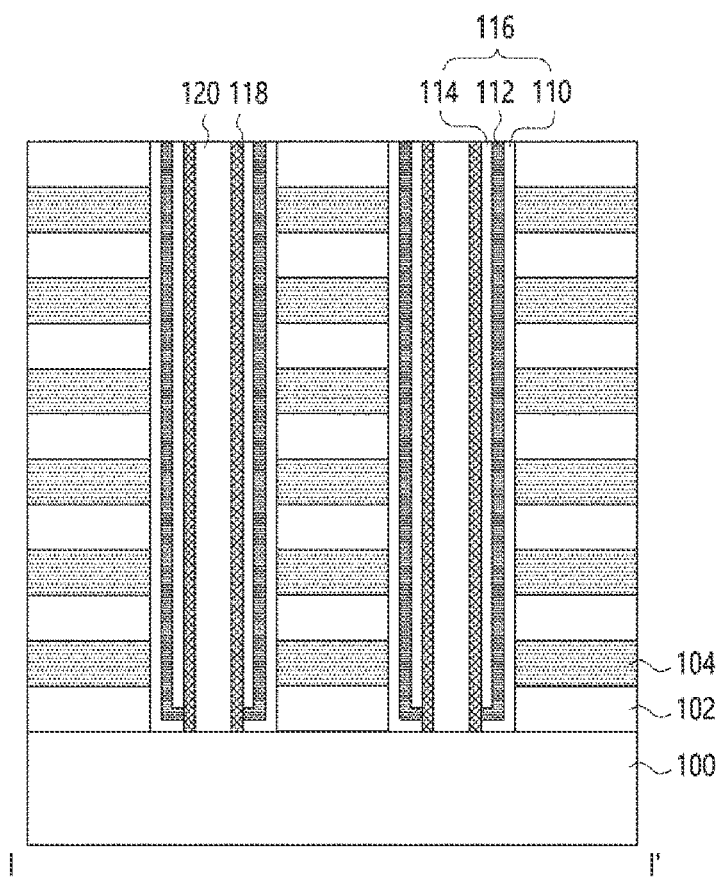

Referring to FIGS. 5A an 5B, a channel plug may be formed in the final channel hole 106F. The channel plug may include the memory layer 116 and the channel layer 118. The memory layer 116 may include a charge blocking layer 110, a charge storage layer 112, and a tunnel insulation layer 114.

The charge blocking layer 110, the charge storage layer 112, and the tunnel insulation layer 114 may be conformally formed along the inner surface of the final channel hole 106F. Thus, the final channel hole 106F might not be filled with the charge blocking layer 110, the charge storage layer 112, and the tunnel insulation layer 114. The charge blocking layer 110 may include an oxide layer that is capable of blocking a charge. The charge storage layer 112 may include nitride that is capable of trapping the charge. The tunnel insulation layer 114 may include silicon oxide that is capable of a charge tunneling.

The channel layer 118 may be conformally formed on the memory layer 116. Thus, the final channel hole 106F might not be filled with the channel layer 118. In this case, the final channel hole 106F with the memory layer 116 and the channel layer 118 may be filled with a core 120. The channel layer 118 may include a semiconductor material, such as silicon, germanium, etc. The channel layer 118 may have a nano structure. The core 120 may include an insulation material, such as oxide. Alternatively, the final channel hole 106F with the memory layer 116 may be filled with the channel layer 118 without the core 120.

Figure 6A:
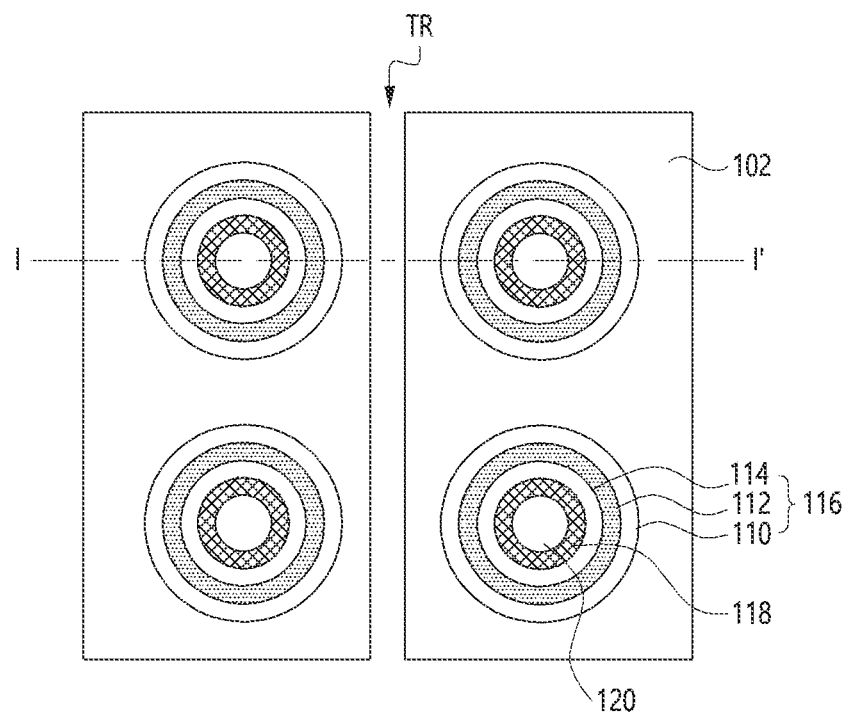
Figure 6B:
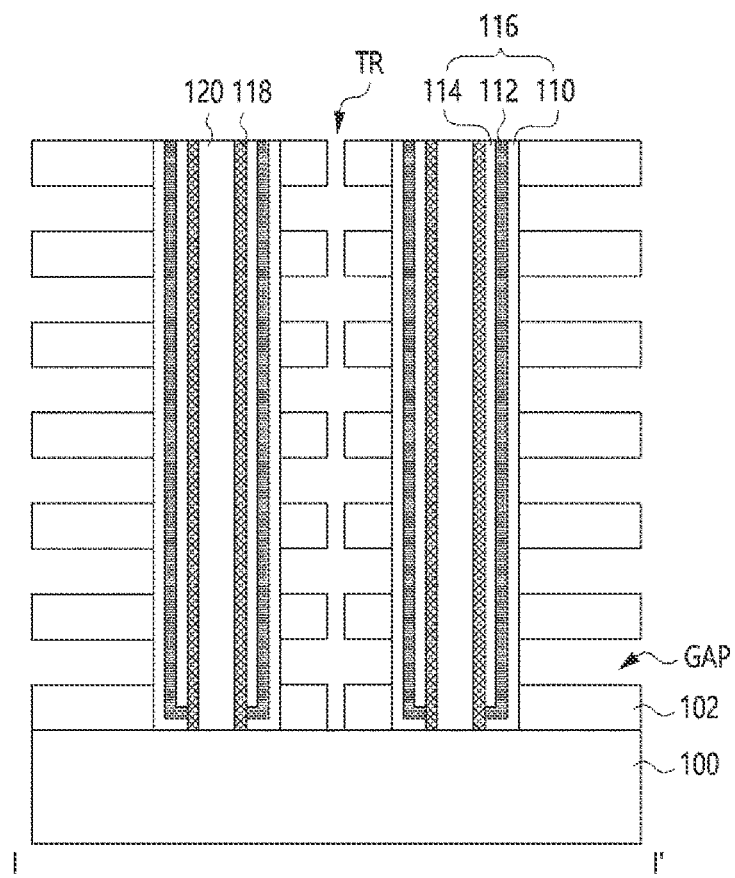

Referring to FIGS. 6A and 6B, the vertical stack structure may be etched to form a trench TR. The trench TR may be configured to divide the vertical stack structure into a plurality of structures.

The second layers 104 that are exposed through the trench TR may then be removed. The second layers 104 may be removed through an isotropic etch process, such as a wet etch process. The second layers 104 may be removed to form gaps GAP between the first layers 102. Each of the gaps GAP may be to positioned between the first layers 102 that are vertically adjacent to each other. Each of the gaps GAP may be configured to surround the channel plug.

Figure 7A:
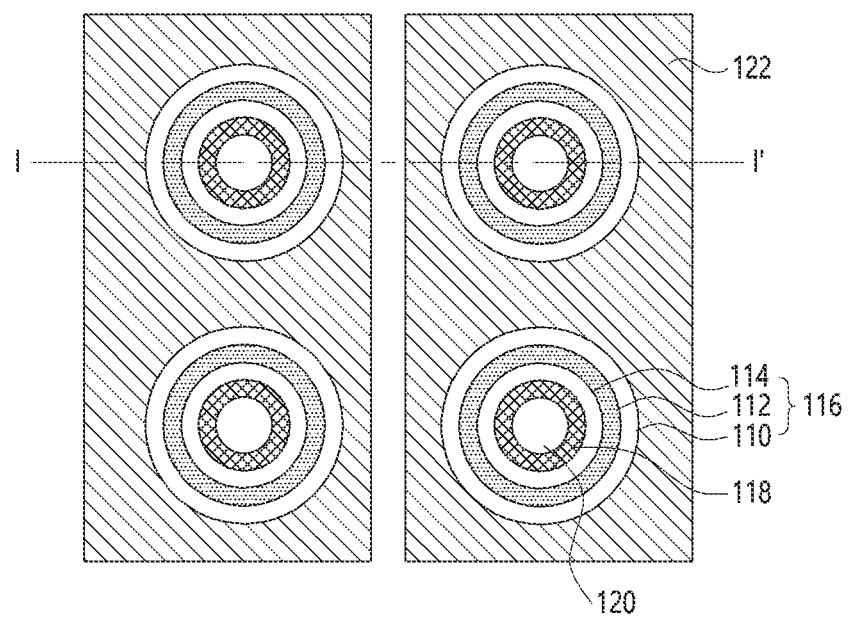
Figure 7B:
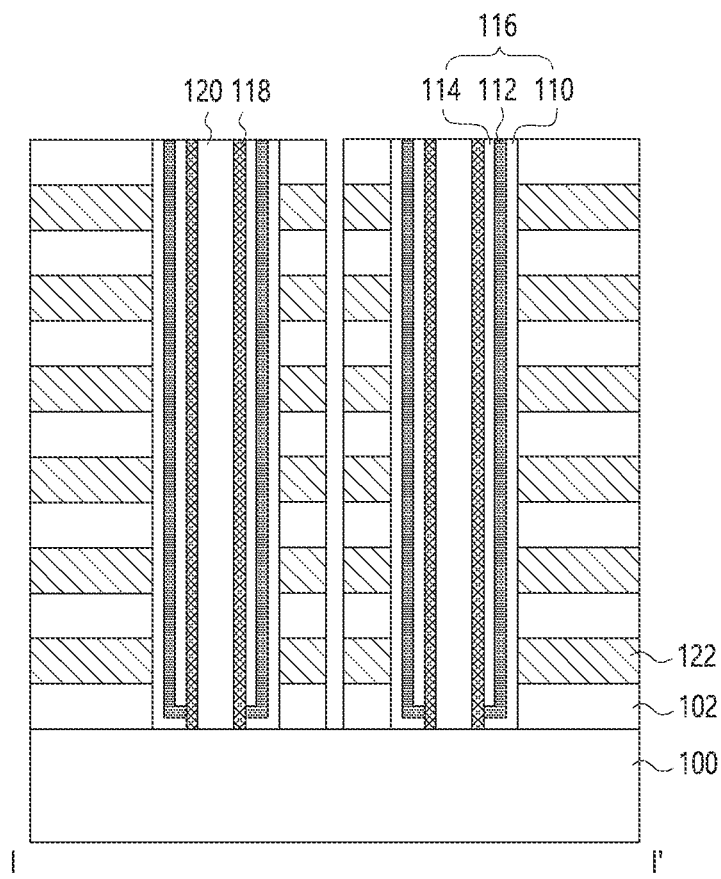

Referring to FIGS. 7A and 7B, the gaps GAP may be filled with the gate electrodes 122. Particularly, the gaps GAP may be is filled with a conductive material. The conductive material may be etched to form the gate electrodes 122 in the gaps GAP. The gate electrodes 122 may be divided by the first layer 102. The gate electrodes 122 may include a metal, a conductive metal nitride, a combination thereof, etc.

Additionally, although not depicted in drawings, a process for forming a drain contact, a process for forming a bit line, etc., may be performed.

FIGS. 8A and 8B and 9A and 9B are views illustrating a method of manufacturing a three-dimensional semiconductor memory device in accordance with example embodiments.

Figure 8A:
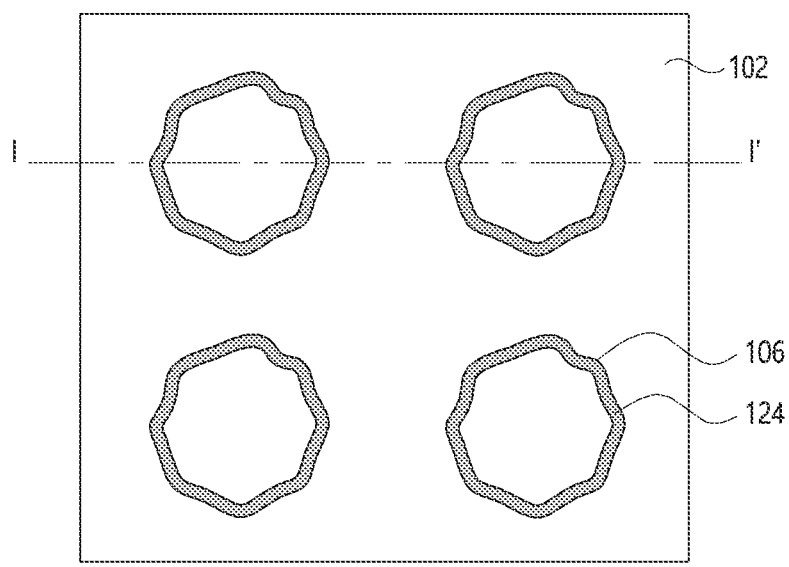
FIGS. 8A and 8B and 9A and 9B are views illustrating a method of manufacturing a three-dimensional semiconductor memory device in accordance with example embodiments.
Figure 8B:
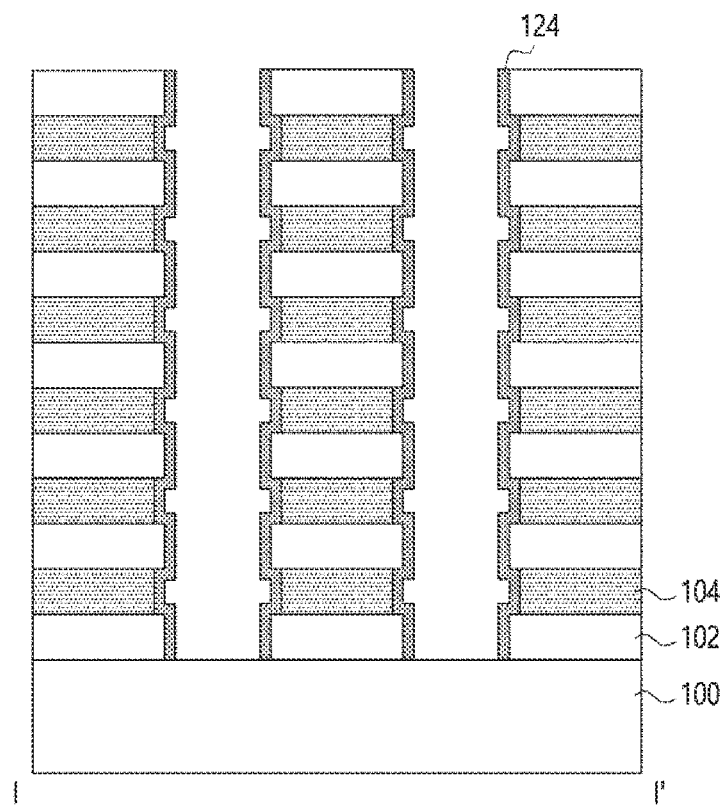
Figure 9A:
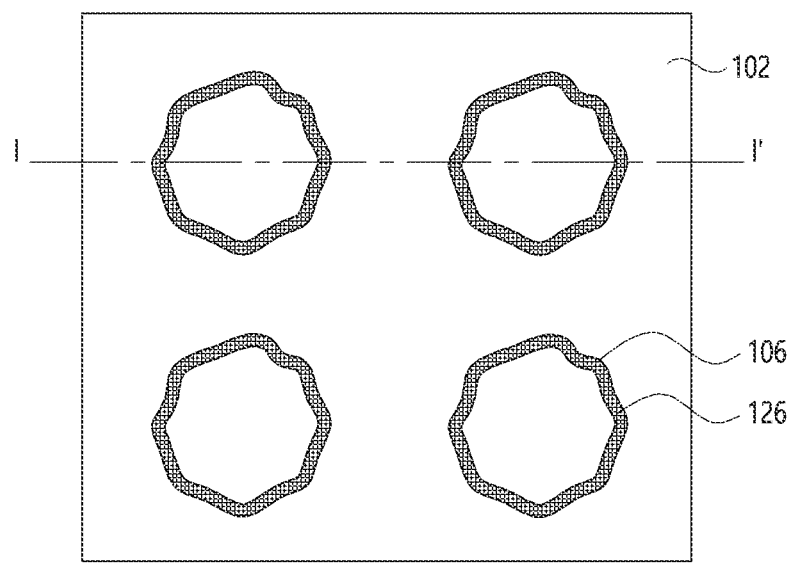

FIGS. 8A and 9A are plan views and FIGS. 8B and 93 are cross-sectional views taken along a line I-I' in FIGS. 8A and 9A.

As mentioned above with reference to FIGS. 2A to 2C, a contact hole may be formed through the vertical stack structure. An actual contact hole 106 may have a polygonal shape. A sacrificial nitride layer 124 may be formed on the vertical stack structure with the actual contact hole 106. The sacrificial nitride layer 124 may be conformally formed along the vertical stack structure so that the actual contact hole 106 might not be filled with the sacrificial nitride layer 124.

Figure 9B:
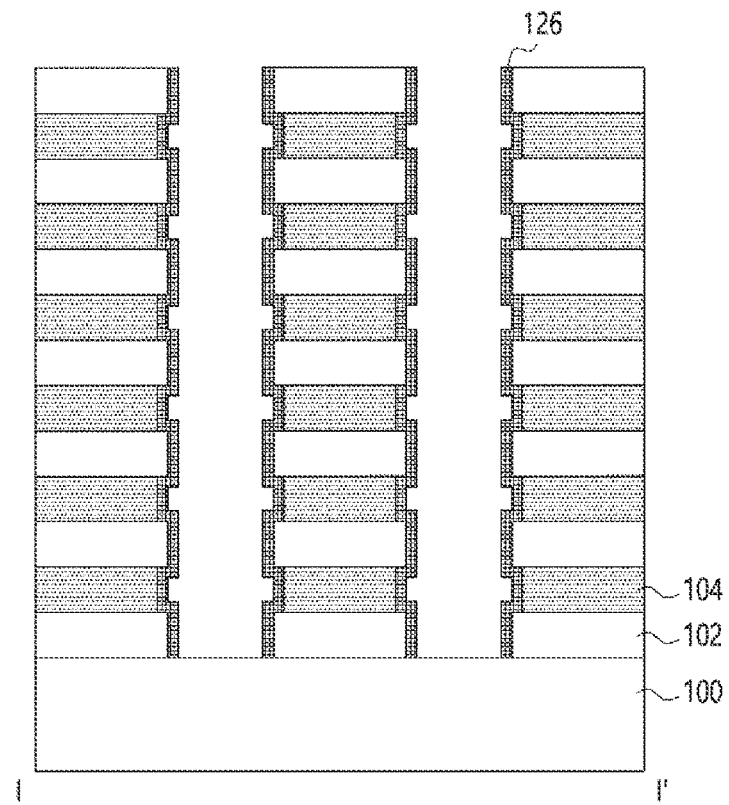

Referring to FIGS. 9A and 9B, the sacrificial nitride layer 124 may be oxidized to form a sacrificial layer 126. The sacrificial layer 126 may include oxynitride. In example embodiments, the second layers 104 of the vertical stack structure may be partially oxidized in accordance with the thickness of the sacrificial nitride layer 124, the shape of the actual contact hole 106, and the oxidation amount.

Referring to FIGS. 4A and 4B, the sacrificial layer 126 may then be removed. The first layers 102 may also be partially remove to form a final contact hole 106F with a diameter longer than a diameter of the actual contact hole 106.

Processes substantially the same as the processes illustrated with reference to FIGS. 5A, 5B, 6A, 6B, 7A and 7B may be performed.

Figure 10:
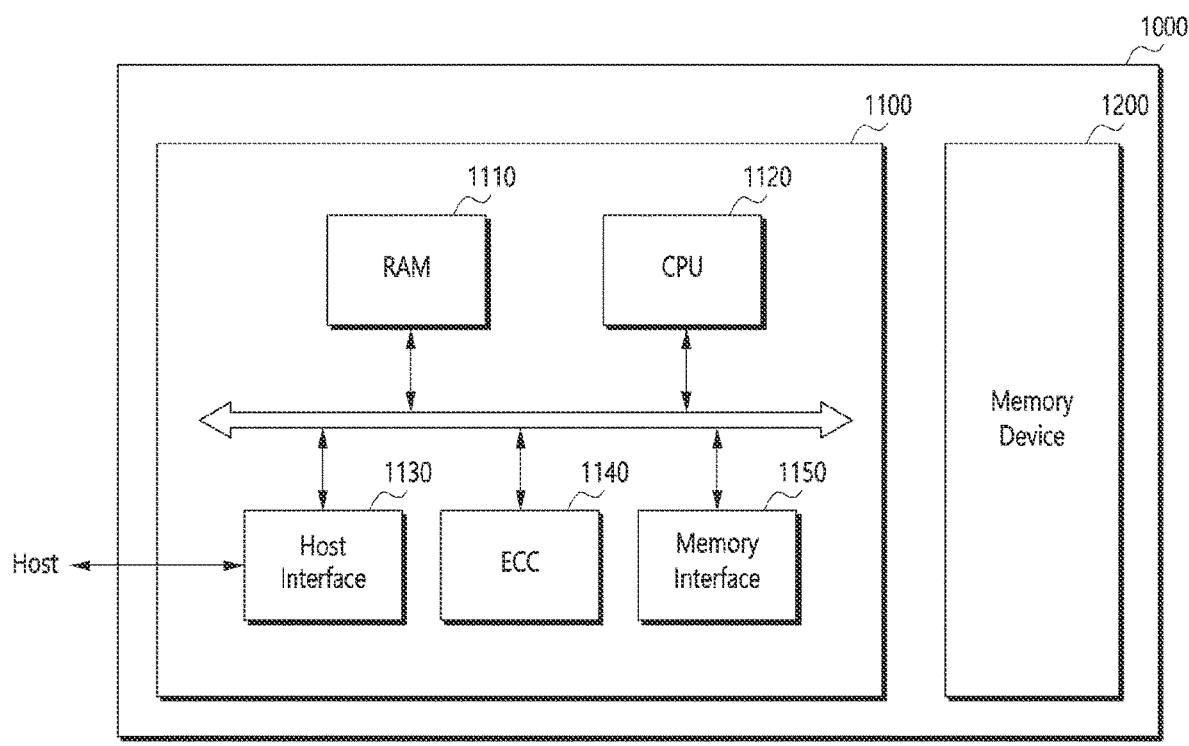
FIG. 10 is a block diagram illustrating a memory system in accordance with example embodiments.

FIG. 10 is a block diagram illustrating a memory system in accordance with example embodiments.

As illustrated in FIG. 10, the memory system 1000 may include a memory device 1200 and a controller 1100.

The memory device 1200 may be used to store various data types, such as text, graphic, and software code. The memory device 1200 may be a non-volatile memory. The memory device 1200 may have the memory cell including the memory layer without any angular portion to prevent the deterioration of the memory cell, as shown in FIG. 1A to FIG. 9B.

The controller 1100 may be coupled to a host and the memory device 1200 and may access the memory device 1200 in response to a request from the host. For example, the controller 1100 may control read, write, erase, and background operations of the memory device 1200.

The controller 1100 may include a random access memory (RAM) 1110, a central processing unit (CPU) 1120, a host interface 1130, an error correction code (ECC) circuit 1140, and a memory interface 1150.

The RAM 1110 may function as an operation memory of the CPU 1120, a cache memory between the memory device 1200 and the host, and a buffer memory between the memory device 1200 and the host. The RAM 1110 may be replaced by a static random access memory (SRAM) or a read only memory (ROM).

The host interface 1130 may be interface with the host. For example, the controller 1100 may communicate with the host through one of various interface protocols including a Universal Serial Bus (USB) protocol, a multimedia card (MMC) protocol, a peripheral component interconnection (PCI) protocol, a PCI express (PCI-E) protocol, an Advanced Technology Attachment (ATA) protocol, a Serial-ATA protocol, a Parallel-ATA protocol, a small computer small interface (SCSI) protocol, an enhanced small disk interface (ESDI) protocol, an Integrated Drive Electronics (IDE) protocol, and a private protocol.

The ECC circuit 1140 may detect and correct errors that to are included in data that is read from the memory device 1200 by using error correction codes (ECCs).

The memory interface 1150 may interface with the memory device 1200. For example, the memory interface 1150 may include a NAND interface or a NOR interface.

For example, the controller 1100 may further include a buffer memory (not illustrated) configured to temporarily store data. The buffer memory may temporarily store data, externally transferred through the host interface 1130, or temporarily store data, transferred from the memory device 1200 through the memory interface 1150. In addition, the controller 1100 may further include ROM storing code data to interface with the host.

As described above, because the memory cells constituting the memory device 1200 include the memory layer without any angle portion, the characteristics of the memory cell and uniformities of the memory cells may be improved.

Figure 11:
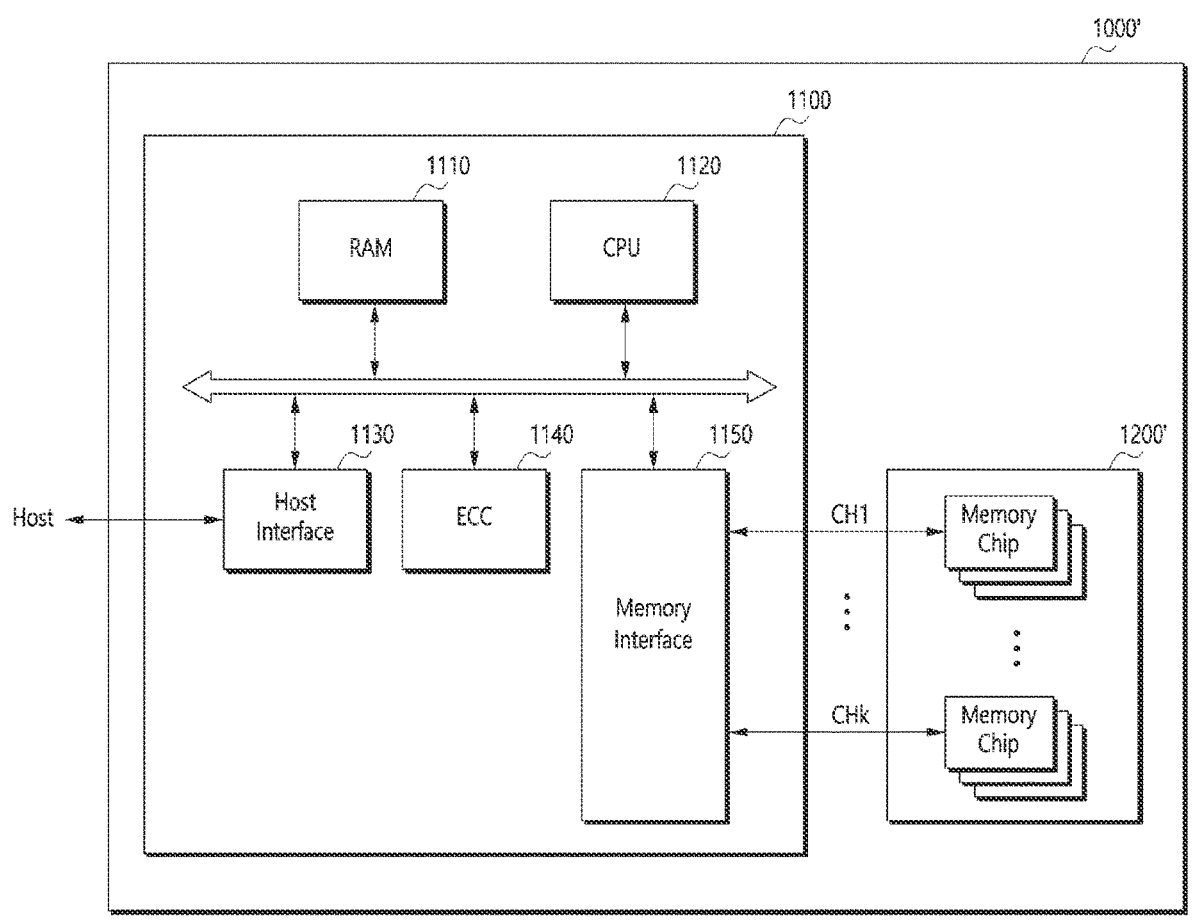
FIG. 11 is a block diagram illustrating a memory system in accordance with example embodiments.

FIG. 11 is a block diagram illustrating a memory system in accordance with example embodiments.

Referring to FIG. 11, the memory system 1000' may include a memory device 1200' and the controller 1100. In addition, the controller 1100 may include the RAM 1110, the CPU 1120, the host interface 1130, the ECC circuit 1140, and the memory interface 1150.

The memory device 1200' may have the memory layer without any angular portion to prevent the deterioration of the memory cell, as shown in FIG. 1A to FIG. 9B.

In addition, the memory device 1200' may be a multi-chip package that is composed of a plurality of memory chips. The plurality of memory chips may be divided into a plurality of groups. The plurality of groups may communicate with the controller 1100 through first to k-th channels CH1 to CHk. In addition, memory chips, included in a single group, may be suitable for communicating with the controller 1100 through a common channel. The memory system 1000' may be modified so that a single memory chip may be coupled to a single channel.

As described above, the memory system 1000' includes the memory cells including the memory layer without any angle portion. Because the characteristics of the memory cells and the uniformities of the memory cells are improved, the characteristics of the memory system are also improved.

Figure 12:
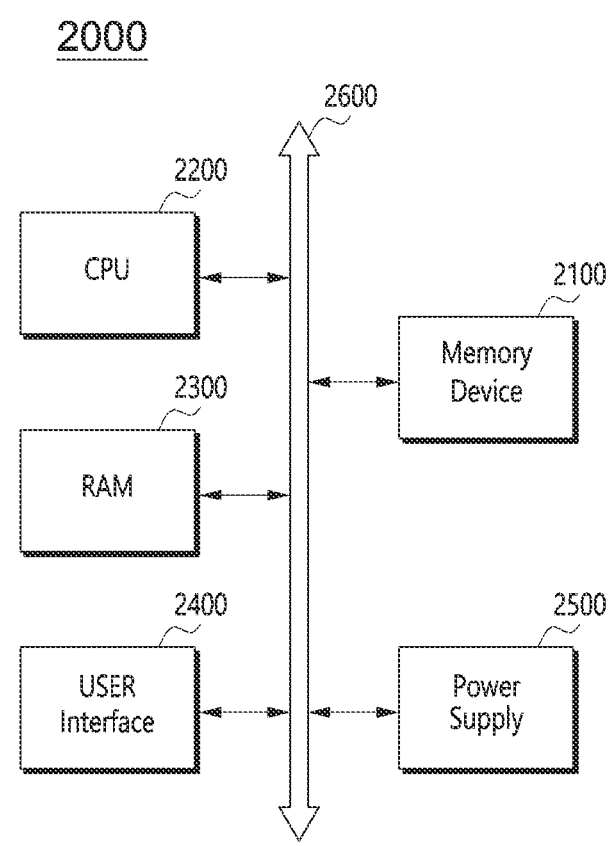
FIG. 12 is a block diagram illustrating a computing system in accordance with example embodiments.

FIG. 12 is a block diagram illustrating a computing system in accordance with example embodiments.

As illustrated in FIG. 12, the computing system 2000 may include a memory device 2100, a CPU 2200, a random-access memory (RAM) 2300, a user interface 2400, a power supply 2500, and a system bus 2600.

The memory device 2100 may store data, which is input through the user interface 2400, and data, which is processed by the CPU 2200. In addition, the memory device 2100 may be electrically coupled to the CPU 2200, the RAM 2300, the user interface 2400, and the power supply 2500. For example, the memory device 2100 may be coupled to the system bus 2600 through a controller (not illustrated) or directly coupled to the system bus 2600. When the memory device 2100 is directly coupled to the system bus 2600, functions of the controller may be performed by the CPU 2200 and the RAM 2300.

The memory device 2100 may be a non-volatile memory. In addition, the memory device 2100 may have the memory cell including the memory layer without any angular portion to prevent the deterioration of the memory cell, as shown in FIG. 1A to FIG. 9B.

In addition, as described above with reference to FIG. 11, the memory device 2100 may be a multi-chip package composed of a plurality of memory chips.

The computing system 2000 with the above-described configuration may be one of various components of an electronic device, such as a computer, an ultra mobile PC (UMPC), a workstation, a net-book, personal digital assistants (PDAs), a portable computer, a web tablet, a wireless phone, a mobile phone, a smart phone, an e-book, a portable multimedia player (PMP), a portable game machine, a navigation device, a black box, a digital camera, a three-dimensional (3D) television, a digital audio recorder, a digital audio player, a digital picture recorder, a digital picture player, a digital video recorder, a digital video player, a device for transmitting/receiving information in wireless environment, one of various electronic devices for home network, one of various electronic devices for computer network, one of various electronic devices for telematics network, an RFID device, and/or one of various devices for computing systems, etc.

As described above, the computing system 2000' is includes the memory cells including the memory layer without any angle portion, Because the characteristics of the memory cells and the uniformities of the memory cells are improved, the characteristics of the computing system 2000' are also improved.

Figure 13:
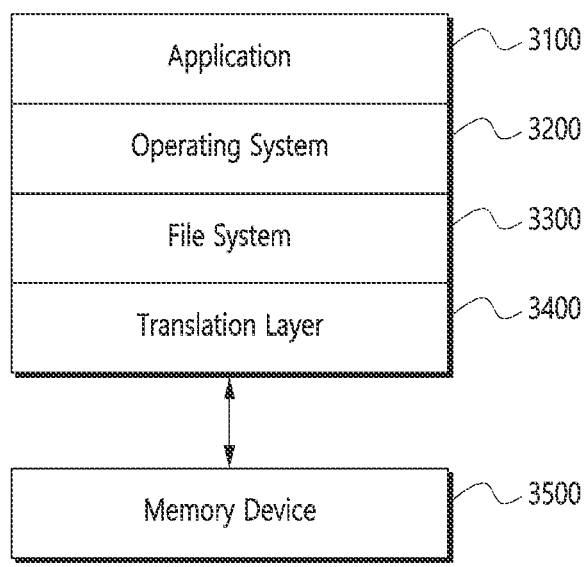
FIG. 13 is a block diagram illustrating a computing system in accordance with example embodiments.

FIG. 13 is a block diagram illustrating a computing system in accordance with example embodiments.

As illustrated in FIG. 13, the computing system 3000 may include a software layer that has an operating system 3200 an application 3100, a file system 3300, and a translation layer 3400. In addition, the computing system 3000 may include a hardware layer, such as a memory system 3500.

The operating system 3100 manages software and hardware resources of the computing system 3000. The operating system 3100 may control program execution of a central processing unit. The application 3200 may include various application programs that are executed by the computing system 3000. The application 3200 may be a utility executed by the operating system 3100.

The file system 3300 may refer to a logical structure configured to manage data and files present in the computing system 3000. The file system 3300 may organize files or data to be stored in the memory device 3500 according to rules. The file system 3300 may be determined depending on the operating system 3100 that is used in the computing system 3000. For example, when the operating system 3100 is a Microsoft Windows-based system, the file system 3300 may be a file allocation table (FAT) or an NT file system (NTFS). In addition, when the operating system 3100 is a Unix/Linux-based system, the file system 3300 may be an extended file system (EXT), a Unix file system (UFS), or a journaling file system (JFS).

FIG. 13 illustrates the operating system 3100, the application 3200, and the file system 3300 in separate blocks. However, the application 3200 and the file system 3300 may be included in the operating system 3100.

The translation layer 3400 may translate an address to be suitable for the memory device 3500 in response to a request from the file system 3300. For example, the translation layer 3400 may translate a logic address, generated by the file system 3300, into a physical address of the memory device 3500, Mapping information of the logic address and the physical address may be stored in an address translation table. For example, the translation layer 3400 may be a flash translation layer (FTL), a universal flash storage link layer (ULL), or the like.

The memory device 3500 may be a non-volatile memory. The memory device 3500 may be the semiconductor memory device, described above with reference to FIGS. 1A to 9B. In addition, the semiconductor memory device 3500 may include a memory layer without any angler portion. Thus, the characteristics of the memory cells and the uniformities of the memory cells are improved.

The computing system 3000 with the above-described configuration may be divided into an operating system layer that is operated in an upper layer region and a controller layer that is operated in a lower level region. The operating system 3200, the application 3100, and the file system 3300 may be included in the operating system layer and driven by an operation memory. In addition, the translation layer 3400 may be included in the operating system layer or the controller layer.

As described above, because the memory device 3500 with the above described memory layer may be applied the computing system 3000, the characteristics of the computing system 3000 may also be improved.

The above described embodiments of the present teachings are intended to illustrate and not to limit the present disclosure. Various alternatives and equivalents are possible.

The present teachings are not limited by the embodiments described herein. Nor are the present teachings limited to any specific type of semiconductor device. Other additions, subtractions, or modifications are possible in view of the present disclosure and are intended to fall within the scope of the appended claims.

What is claimed is:

1. A method of manufacturing a three-dimensional semiconductor memory device, the method comprising:
   forming a preliminary channel hole through a vertical stack structure including first layers and second layers that are alternately stacked;
   oxidizing an inner surface of the vertical stack structure adjacent to the preliminary channel hole to form a sacrificial layer;
   partially removing the sacrificial layer, the first layers, and the second layers to form a final channel hole; and
   forming a channel plug in the final channel hole.

2. The method of claim 1, wherein the preliminary channel hole has a size 70% to 95% of a size of the final channel hole.

3. The method of claim 1, wherein the sacrificial layer includes silicon oxynitride, silicon oxide, or a combination thereof.

4. The method of claim 1, wherein the preliminary channel hole has a shape that corresponds to a shape of the second layers.

5. The method of claim 1, wherein the preliminary channel hole has a polygonal shape including a first portion having a concave shape and a second portion having a convex shape in a plane; and
   wherein the sacrificial layer on the first portion and the second portion has different thicknesses.

6. The method of claim 5, wherein the thickness of the sacrificial layer on the first portion is thinner than the thickness of the sacrificial layer on the second portion.

7. The method of claim 1, wherein the oxidizing of the inner surface of the preliminary channel hole to form the sacrificial layer and the removing of the sacrificial layer are repeated.

8. The method of claim 1, further comprising conformally forming a sacrificial nitride layer along the preliminary channel hole before forming the sacrificial layer.

9. The method of claim 8, wherein the forming of the sacrificial layer includes partially oxidizing the sacrificial nitride layer and the vertical stack structure.

10. The method of claim 1, further comprising:
    removing the second layers to form gaps; and
    filling the gaps with gate electrodes.

* * * * *